United States Patent
Johnston et al.

(10) Patent No.: US 7,435,679 B2
(45) Date of Patent: Oct. 14, 2008

(54) ALLOYED UNDERLAYER FOR MICROELECTRONIC INTERCONNECTS

(75) Inventors: Steven W. Johnston, Portland, OR (US); Juan E. Dominguez, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 346 days.

(21) Appl. No.: 11/006,844

(22) Filed: Dec. 7, 2004

(65) Prior Publication Data

US 2006/0118968 A1    Jun. 8, 2006

(51) Int. Cl.
*H01L 21/44* (2006.01)

(52) U.S. Cl. ............... 438/661; 438/627; 438/628; 438/629; 438/639; 438/643; 438/644; 438/648; 438/650; 438/682; 438/686; 257/E23.157; 257/E23.163; 257/E21.584; 257/E21.591; 257/E21.579

(58) Field of Classification Search ........... 438/627, 438/628, 629, 643, 644, 648, 650, 685, 686, 438/661; 257/E23.157, E23.163, E21.584, 257/E21.591, E21.579
See application file for complete search history.

(56) References Cited

U.S. PATENT DOCUMENTS

| | | |
|---|---|---|
| 6,294,836 B1 | 9/2001 | Paranjpe et al. |
| 6,541,860 B1 * | 4/2003 | Woo et al. ............ 257/751 |
| 2002/0006468 A1 | 1/2002 | Paranjpe et al. |
| 2004/0084773 A1 | 5/2004 | Johnston et al. |

OTHER PUBLICATIONS

PCT Application No. PCT/US2005/044699, *International Search Report and Written Opinion*, mailed Jun. 9, 2006, 11 pages.

* cited by examiner

*Primary Examiner*—George R. Fourson
*Assistant Examiner*—Julio J. Maldonado

(57) ABSTRACT

Apparatus and methods of fabricating a microelectronic interconnect having an underlayer which acts as both a barrier layer and a seed layer. The underlayer is formed by co-depositing a noble metal and a barrier material, such as a refractory metal, or formed during thermal post-treatment, such as thermal annealing, conducted after two separately depositing the noble metal and the barrier material, which are substantially soluble in one another. The use of a barrier material within the underlayer prevents the electromigration of the interconnect conductive material and the use of noble material within the underlayer allows for the direct plating of the interconnect conductive material.

6 Claims, 8 Drawing Sheets

ALLOYED UNDERLAYER FOR MICROELECTRONIC INTERCONNECTS

BACKGROUND OF THE INVENTION

1. Field of the Invention

An embodiment of the present invention relates to microelectronic device fabrication. In particular, an embodiment of the present invention relates to a noble metal alloyed with a barrier material as a single alloyed underlayer that functions as both a barrier layer and a seed layer for metal contacts.

2. State of the Art

The microelectronic device industry continues to see tremendous advances in technologies that permit increased integrated circuit density and complexity, and equally dramatic decreases in power consumption and package sizes. Present semiconductor technology now permits single-chip microprocessors with many millions of transistors, operating at speeds of tens (or even hundreds) of MIPS (millions of instructions per second), to be packaged in relatively small, air-cooled microelectronic device packages. These transistors are generally connected to one another or to devices external to the microelectronic device by conductive traces and contacts through which electronic signals are sent and/or received.

One process used to form contacts is known as a "damascene process". In a typical damascene process, a photoresist material is patterned on a first surface of a dielectric material. The dielectric material is then etched through the photoresist material patterning to form a hole or trench extending at least partially into the dielectric material from the dielectric material first surface. The photoresist material is then removed (typically by an oxygen plasma) and a barrier layer may be deposited (such as by atomic layer deposition or physical vapor deposition) to line the hole or trench in order to prevent conductive material (particularly copper and copper-containing alloys), which will be subsequent be deposited into the opening, from migrating into dielectric material. The migration of the conductive material can adversely affect the quality of microelectronic device, such as leakage current and reliability circuit reliability.

After the formation of the barrier layer, a seed material is deposited (such as by physical vapor deposition) on the barrier layer. The seed material provides a nucleation site for a subsequent plating process, for example, performing a conventional copper electroplating process to form a copper layer. The resulting structure is planarized, usually by a technique called chemical mechanical polish (CMP), which removes the conductive material and barrier layer that is not within the hole from the surface of the dielectric material, to form a conductive via (if a hole is filled) or a trace (if a trench is filled), as will be understood to those skilled in the art.

Barrier layers used for copper-containing conductive materials are usually nitrogen-containing metals, including, but not limited to tantalum nitride, tantalum carbon nitride, titanium nitride, and titanium carbon nitride. One issue is that the noble metals used a seed layers can have poor adhesion to such barrier layers when the two are deposited as distinct layers, particularly when under vacuum. Due to this poor adhesion, the noble metal seed layer tends to dewet (agglomerate) during thermal annealing in latter processes. This can lead to poor electromigration performance and may generate voids during copper plating, if the noble seed layer becomes discontinuous, as will be understood by those skilled in the art. If fact, delamination may occur during the CMP process, if the adhesion is poor enough.

Therefore, it would be advantageous to develop apparatus and techniques to overcome the limitations of such barrier layers and seed layers.

BRIEF DESCRIPTION OF THE DRAWINGS

While the specification concludes with claims particularly pointing out and distinctly claiming that which is regarded as the present invention, the advantages of this invention can be more readily ascertained from the following description of the invention when read in conjunction with the accompanying drawings to which:

DETAILED DESCRIPTION OF THE ILLUSTRATED EMBODIMENT

Figure 1:
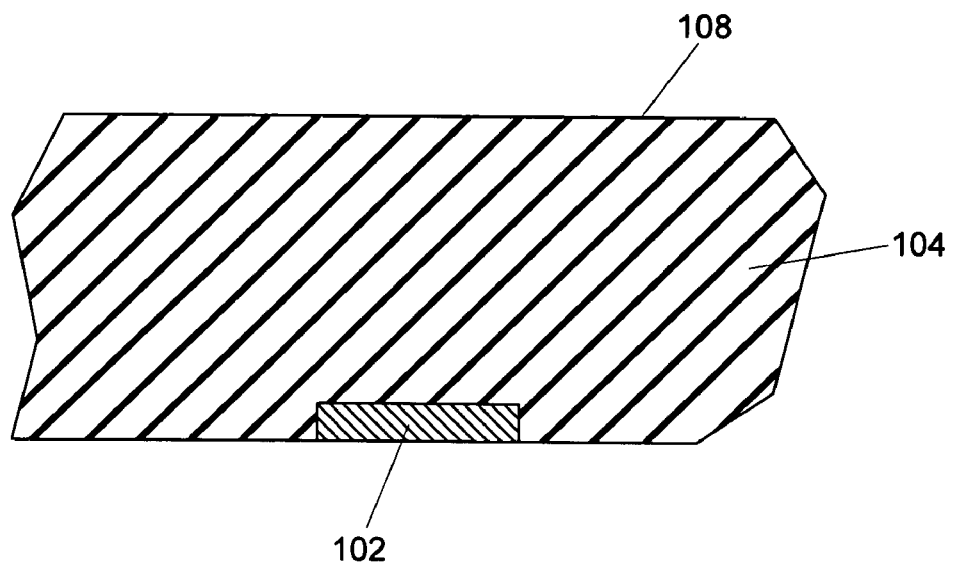
FIG. 1 is a side cross-sectional view of a portion of a conductive element covered by at least one dielectric layer, according to the present invention.

In the following detailed description, reference is made to the accompanying drawings that show, by way of illustration, specific embodiments in which the invention may be practiced. These embodiments are described in sufficient detail to enable those skilled in the art to practice the invention. It is to be understood that the various embodiments of the invention, although different, are not necessarily mutually exclusive. For example, a particular feature, structure, or characteristic described herein, in connection with one embodiment, may be implemented within other embodiments without departing from the spirit and scope of the invention. In addition, it is to be understood that the location or arrangement of individual elements within each disclosed embodiment may be modified without departing from the spirit and scope of the invention. The following detailed description is, therefore, not to be taken in a limiting sense, and the scope of the present invention is defined only by the appended claims, appropriately interpreted, along with the full range of equivalents to which the claims are entitled. In the drawings, like numerals refer to the same or similar functionality throughout the several views.

The present invention relates to a method of fabricating a single underlayer which acts as both a barrier layer and a seed layer. The underlayer is formed by co-depositing a noble metal and a barrier material, such as a refractory metal or formed during a thermal post-treatment, such as an anneal, after separately depositing the barrier material and the noble metal, which are substantially soluble in one another.

FIGS. 1-12 illustrate a dual damascene process for fabricating a microelectronic device according to one embodiment of the present invention. FIG. 1 illustrates a conductive element 102 within at least one dielectric material 104. It is, of course, understood that the conductive element 102 may include, but is not limited to, a conductive interconnect, a transistor gate, a transistor source, a transistor drain, and the like. Those skilled in the art will appreciate that the dielectric layer 104 may be formed from a variety of materials, thicknesses or multiple layers of material. The dielectric layer 104 may be made from any material or materials that serve to separate and insulate the different conductive components and may include, but is not limited to, silicon dioxide, low-K dielectrics, organic materials or inorganic materials.

Figure 2:
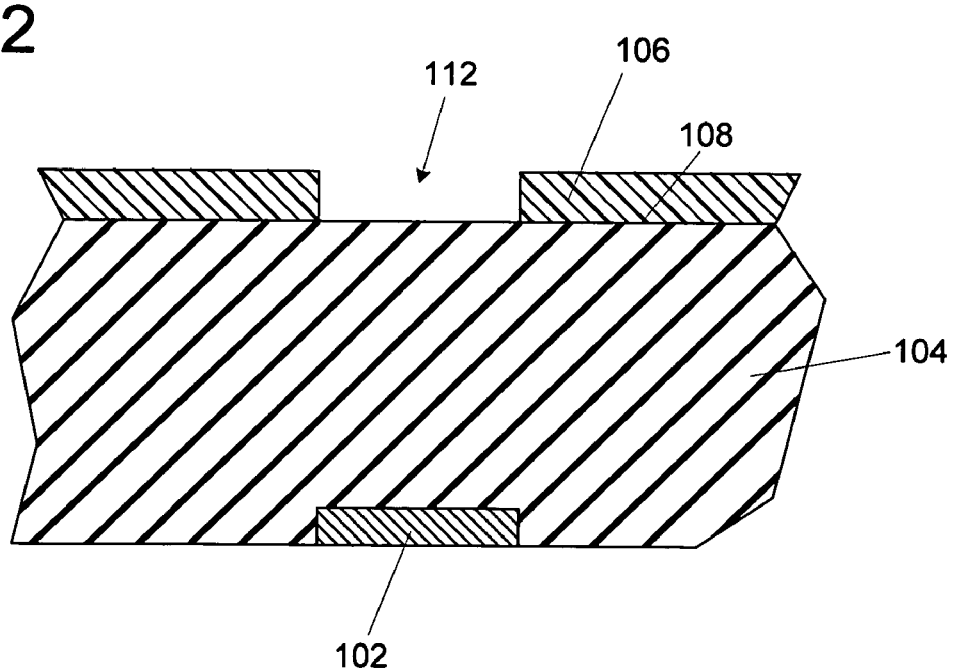
FIG. 2 is a side cross-sectional view of the structure of FIG. 1, wherein a first resist material is patterned on a first surface of the dielectric layer, according to the present invention.
Figure 3:
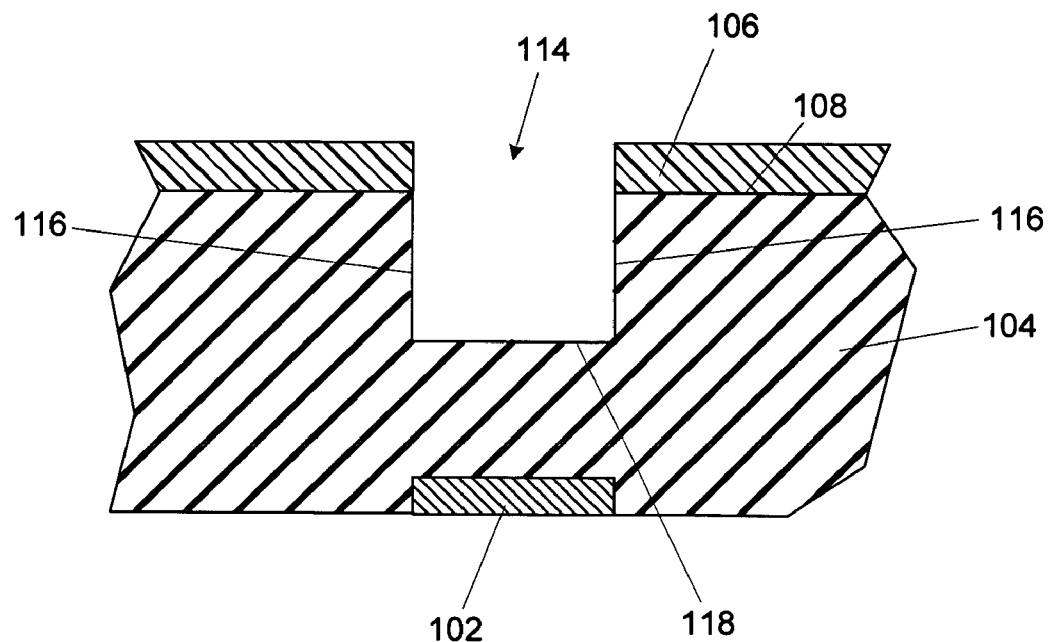
FIG. 3 is a side cross-sectional view of the structure of FIG. 2, wherein a trench is etched at least partially into the dielectric material, according to the present invention.
Figure 4:
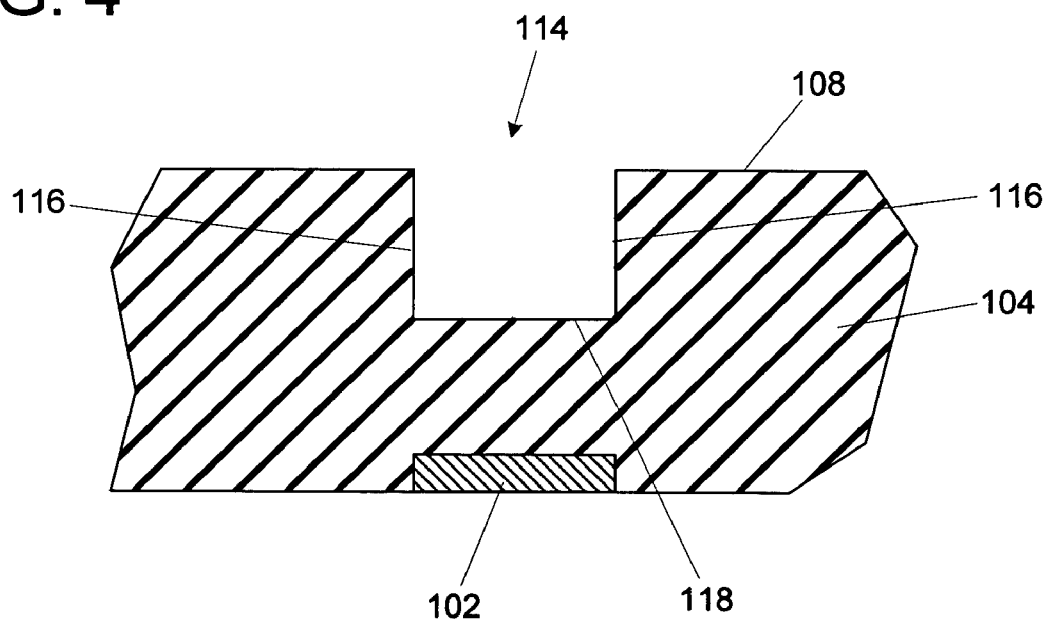
FIG. 4 is a side cross-sectional view of the structure of FIG. 3, wherein the first resist material is removed from the dielectric material, according to the present invention.

A first photoresist material 106 is patterned, such as by photolithography as known in the art, on a first surface 108 of the dielectric material 104 with at least one opening 112 therethrough, as shown in FIG. 2. The dielectric material 104 is then etched through the opening 112 to form a trench 114, comprising at least one side wall 116 and a bottom surface 118, extending into the dielectric material 104 from the dielectric material first surface 108, as shown in FIG. 3. As shown in FIG. 4, the first photoresist material 106 is then removed, such as by an ashing process known in the art.

Figure 5:
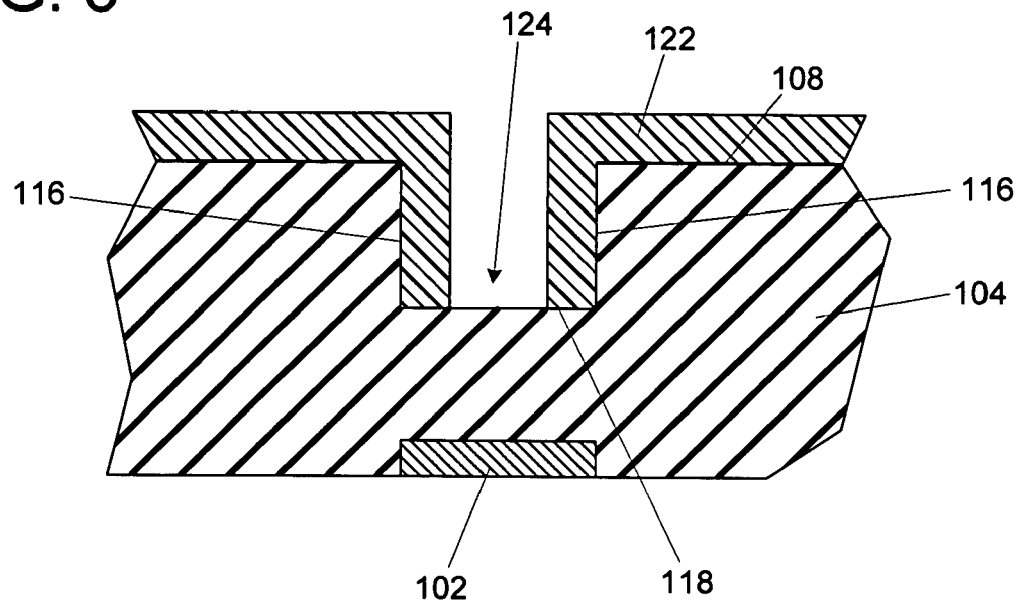
FIG. 5 is a side cross-sectional view of the structure of FIG. 4, wherein a second resist material is patterned on a first surface of the dielectric layer and abutting the sides of the trench, according to the present invention.
Figure 6:
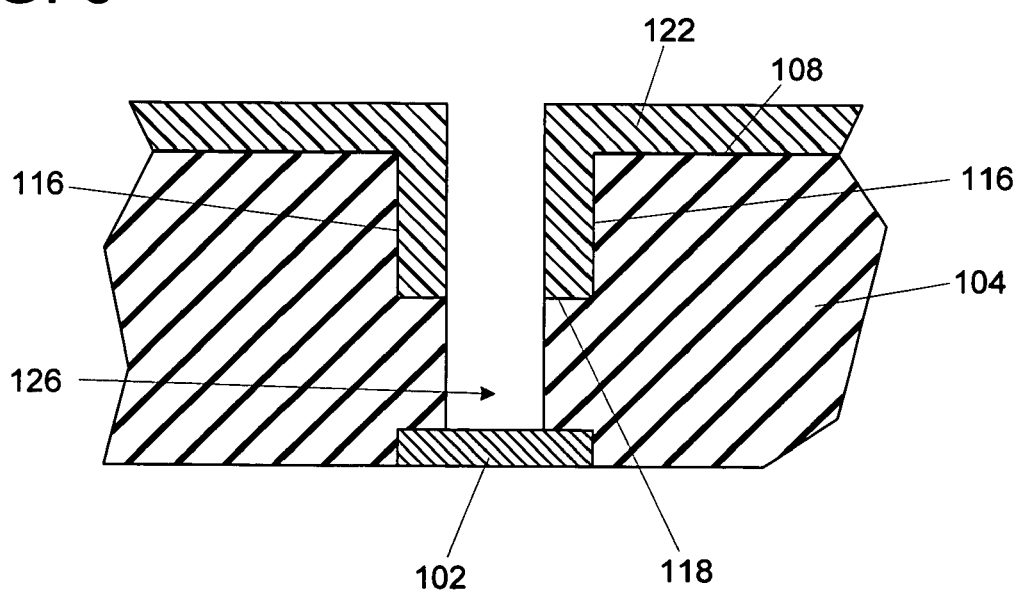
FIG. 6 is a side cross-sectional view of the structure of FIG. 5, wherein a via is etched into the dielectric material to expose at least a portion of the conductive element, according to the present invention.
Figure 7:
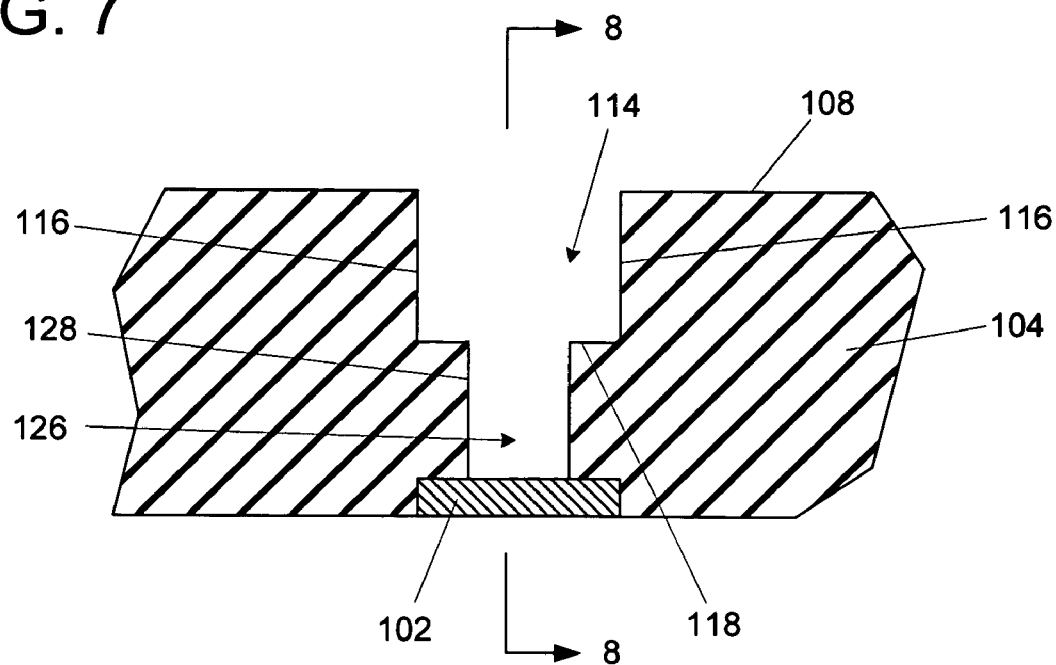
FIG. 7 is a side cross-sectional view of the structure of FIG. 6, wherein the second resist material is removed from the dielectric material, according to the present invention.
Figure 8:
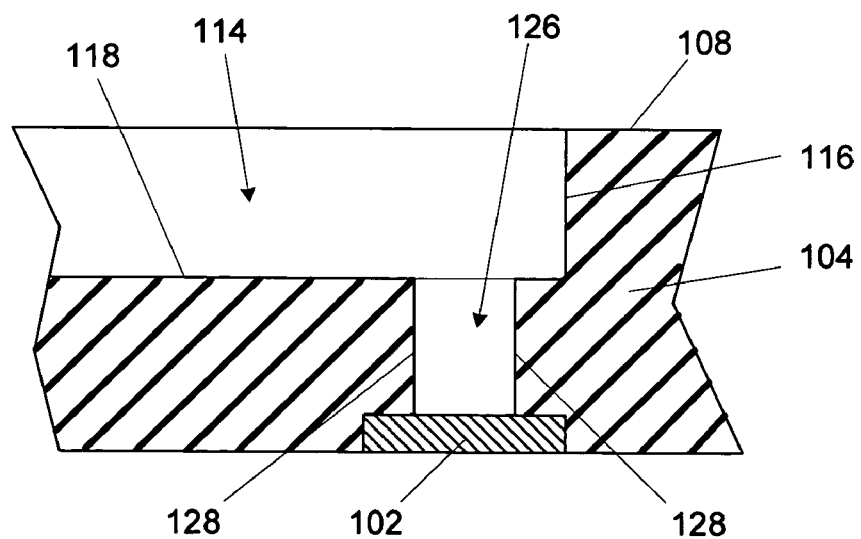
FIG. 8 is a side cross-sectional view along line 8-8 of the structure of FIG. 7, according to the present invention.

As shown in FIG. 5, a second photoresist material 122 is patterned, such as by photolithography as known in the art, on the dielectric material first surface 208 and may be partially within the trench 114 (see FIG. 4), with at least one opening 124 therethrough within the trench 114. The dielectric material 104 is then etched through the opening 124 to form a hole 126, comprising at least one side wall 128, extending through the dielectric material 104 from the trench bottom surface 118 to the conductive element 102, as shown in FIG. 6. As shown in FIGS. 7 and 8 (cross-section view along line 8-8 of FIG. 7), the second photoresist material 122 is then removed, such as by an ashing process known in the art.

Figure 9:
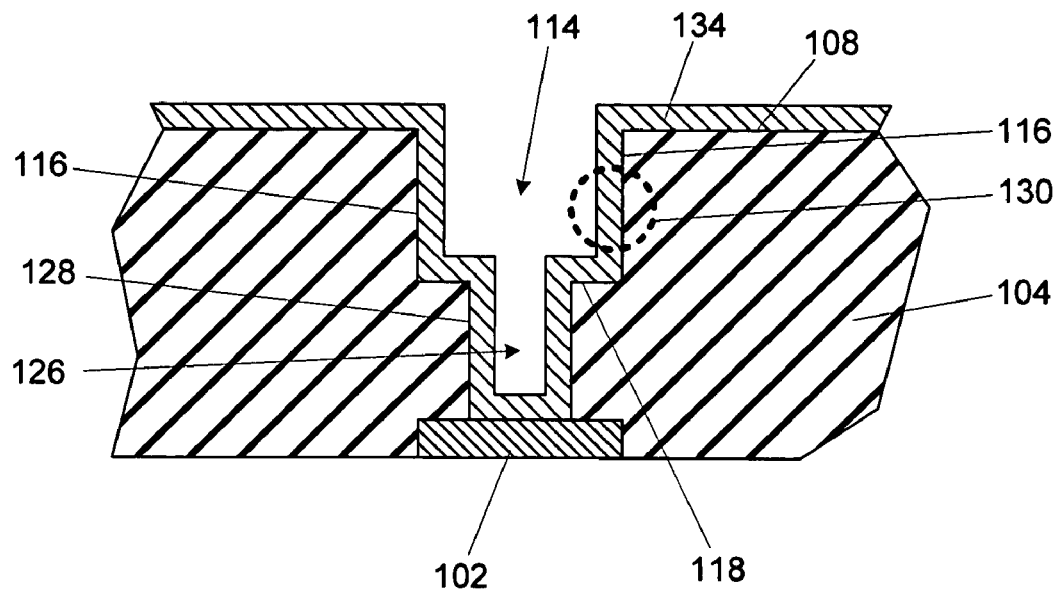
FIG. 9 is a side cross-sectional view of the structure of FIG. 7, wherein an alloyed underlayer is deposited to line the trench and the hole, according to the present invention.
Figure 10:
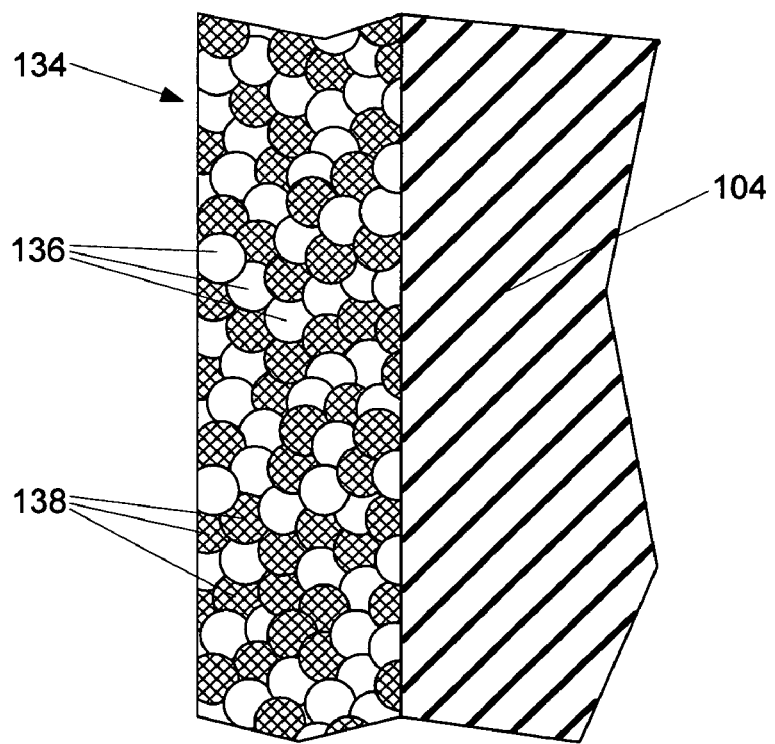
FIG. 10 is a side cross-sectional view close up view of the alloyed underlayer shown as inset 130 in FIG. 9, according to the present invention.

As shown in FIGS. 9 and 10, an alloyed underlayer 134 is substantially conformally deposited to abut the dielectric material first surface 108, the trench sidewall(s) 116, the trench bottom surface 118, the hole side sidewall(s) 128, and a portion of the conductive element 102, as previously discussed. The alloyed underlayer 134 comprises an alloy comprising a barrier material 136, including refractory metals, and a noble metal 138 (see FIG. 10), which are co-deposited or formed during thermal post-treatment, such as an anneal, after two separately depositing the barrier material and the noble metal, which are substantially soluble in one another. The barrier material 136 may include, but is not limited to, tantalum, titanium, tungsten, molybdenum, and zirconium. The barrier material may also be nitrided and/or carbided to improve its diffusion barrier properties (particularly with regard to copper diffusion). The noble metal 138 may include, but is not limited to, ruthenium, platinum, palladium, rhenium, osmium, iridium, gold, and rhodium. The use of a noble metal in the alloyed underlayer 134 allows for a subsequently plated metal to be directly plated on the alloyed underlayer 134 without requiring the use of an intermediate seed layer, as will be understood to those skilled in the art. In one embodiment, the barrier material and noble metal ratio to carbon and/or nitrogen can be about 1:1; however, to improve adhesion to the subsequently plated conductive material, the ratio can be increased by changes in the deposition process to greater than 1:1.

The amount of barrier material and noble metal deposited will vary significant depending on the materials used. It may be desired to have an alloyed underlayer 134 with a higher content of the barrier material 136 than the noble metal 138 in order to improve the electromigration prevention. However, too much barrier material 136 may cause excess oxidation prior to the subsequent plating of the conductive material of the interconnect to be formed and lead to poor adhesion. Furthermore, if an electroplating process used to deposit the conductive material, the alloyed underlayer 134 should be conductive. Therefore, if a nitrided refractory metal barrier material 136 is used, a higher content of noble metal 138 should be in the alloyed underlayer 134, as the nitrided refractory metal is significantly less conductive than noble metals (electroless plating does not have this concern).

The present invention has numerous advantages, which may include, but is not limited to, improved adhesion and subsequent improved electromigration performance due to the bonding between the barrier material and the noble metal that may occur during the co-deposition process, improved wetting (reduced agglomeration) of the noble metal to the barrier material due to it being alloyed during deposition as opposed to being a subsequently deposited, discrete film layer, and increased run rate by combining the barrier layer and the seed layer into a single layer in a single deposition process instead of two distinct layers formed by two distinct deposition processes.

It has been found that both tantalum nitride and titanium carbide barrier materials can be co-deposited with either ruthenium or platinum noble metal on carbon doped oxide (dielectric material 104) at temperatures of between about 250 and 350 degrees Celsius. It has also been found that alloying materials during deposition does not adhere well if deposited as two discrete layers. Furthermore, it is understood that the alloy, composite or graded film can be obtained also by post-processing (annealing) after deposition.

The alloyed underlayer 134 may be made by various processes, including physical vapor deposition (PVD), chemical vapor deposition (CVD), atomic layer deposition (ALD), as will be understood in the art. For example, an alloyed target could be used in a sputtering apparatus to directly lay down the alloyed underlayer 134. In another example, the alloyed underlayer 134 may be formed by vapor deposition, wherein the reactant gases (e.g., PDMAT (pentadimethylamino-tantalum), $NH_3$, $Ru(thd)_3$, [thd=2,2,6,6-tetramethylheptane-3,5-dionate], and $H_2$ or $O_2$) may be sequentially pulsed into a heated chamber. The gases could also, of course, be co-pulsed. For a PVD system, the PVD chamber conditions may have a pressure from between about 1E-6 and 1E-9 Torr with pressures during deposition from between about 0.01 and 50 mTorr, DC power to the target from between about 20 and 50 KW, RF wafer (microelectronic substrate) bias to the target, and the wafer (microelectronic substrate) itself need not be heated and may, in fact, be cooled. For an ALD system, the pulse durations may be less than about 2 seconds for the metal containing reactant gases (e.g., PDMAT and $Ru(thd)_3$) and the chamber pressure may be between about 0.1 and 50 Torr with a wafer (microelectronic substrate) temperature between about 100 and 400 degrees Celsius. To operated in an ALD mode as opposed to a CVD mode, an inert purge gas, such as argon or nitrogen, may be used to purge excess reactant gas(es) from the chamber prior to the introduction the next pulse reactant gas(es), as will be understood those skilled in the art. Furthermore, when refractory materials are used as barrier material, antireflective coatings and bottom antireflective coatings may be used, as will be understood to those skilled in the art.

Figure 11:
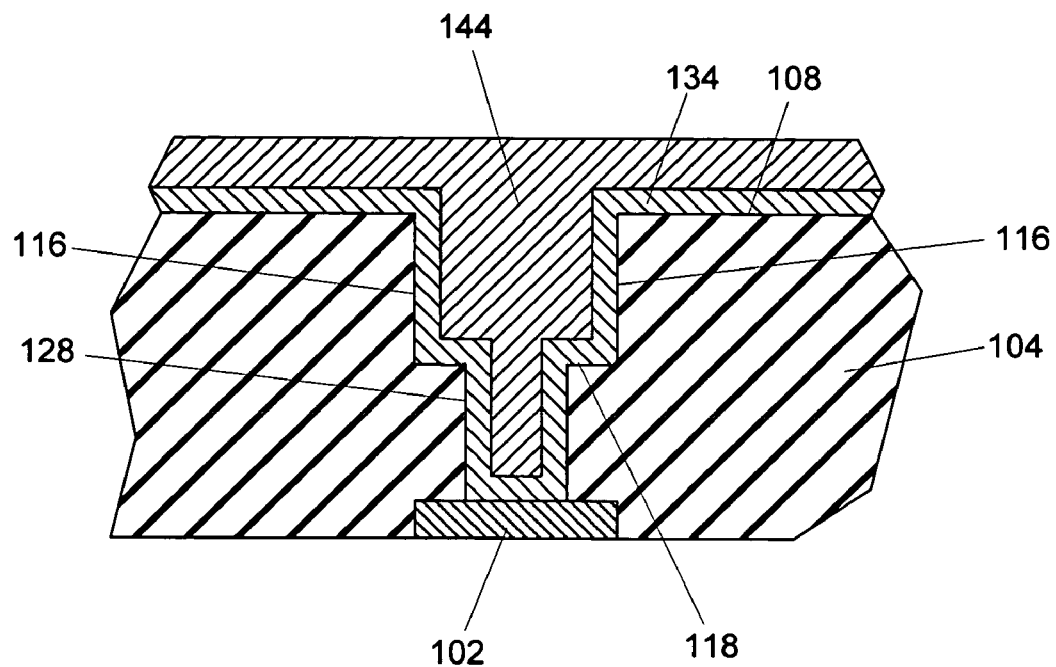
FIG. 11 is a side cross-sectional view of the structure of FIG. 10, wherein a conductive material is deposited in the hole and the trench, according to the present invention.
Figure 12:
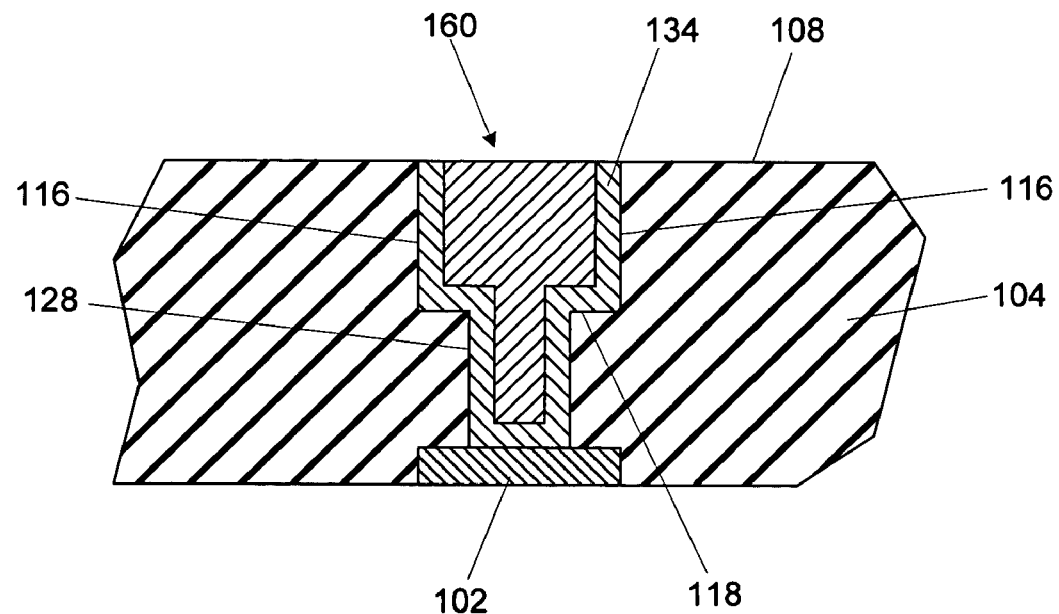
FIG. 12 is a side cross-sectional view of the structure of FIG. 11, wherein the conductive material which in not disposed within the hole and trench is removed, according to the present invention.

As shown in FIG. 11, the conductive material 144, such as copper or copper alloy, is deposited on the underlayer 142 to fill the trench 114 and the hole 126. As shown in FIG. 12, the conductive material 144 and the alloyed underlayer 134 is removed, such as by a chemical mechanical polish process, as will be understood to those skilled in the art, to form an interconnect 160. Although the formation of interconnect 160 is should to be a dual damascene process, the present invention is not so limited. The present invention can be use in any process or structure in which a barrier layer and a seed layer could be replaced by the single underlayer herein described.

Figure 13:
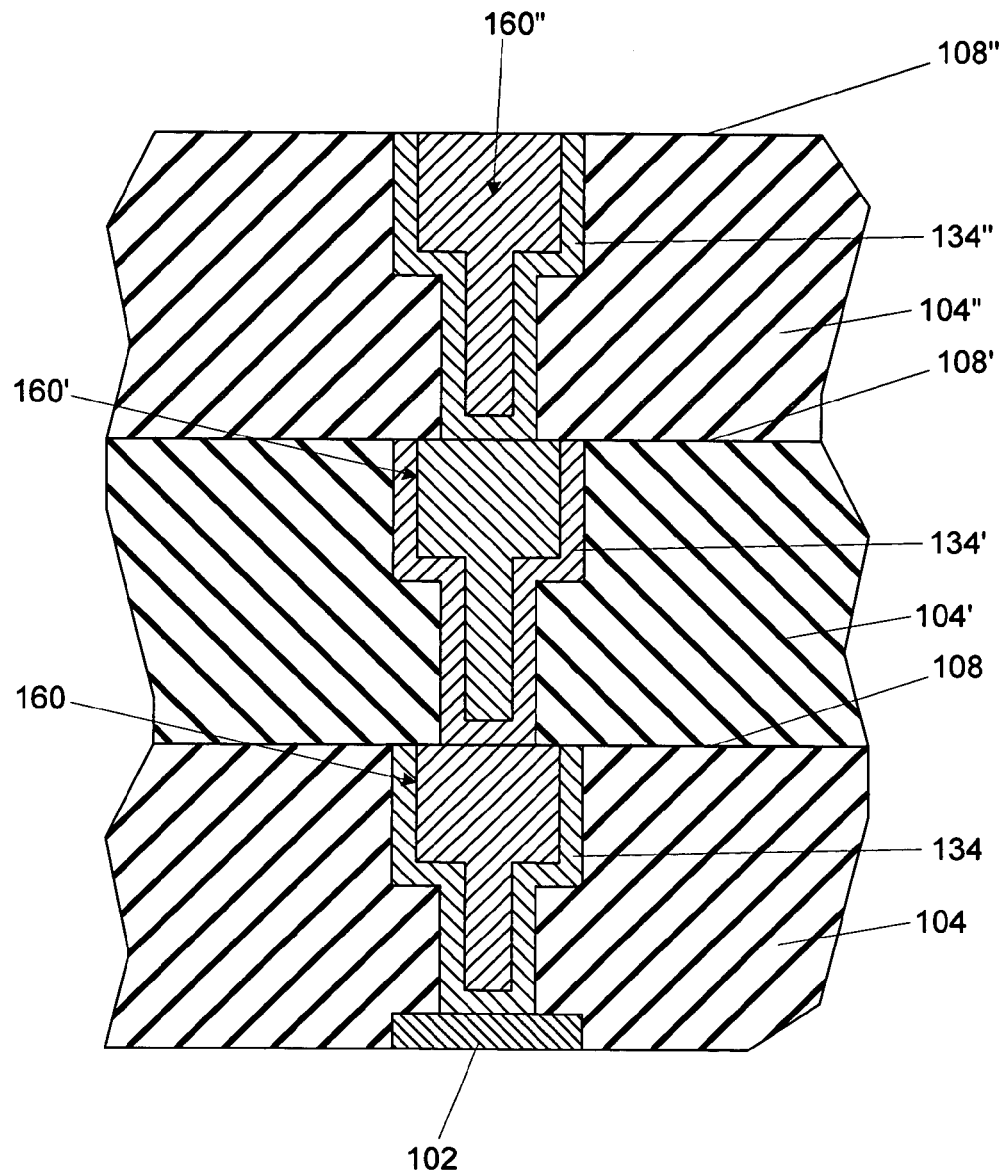
FIG. 13 is a side cross-sectional view of multiple interconnect layers, according to the present invention.

As shown in FIG. 13, the process of the present invention can be used to form multiple interconnect layers, as will be understood to those skilled in the art. In FIG. 13, similar stacked elements are distinguished by ' and ". The dielectric material is designated as 104 in the first layer, 104' in the second layer, and 104" in the third layer. The dielectric material layer first surface is designated as 108 in the first layer, 108' in the second layer, and 108" in the third layer. The barrier layer is designated as 134 in the first layer, 134' in the second layer, and 134" in the third layer. The interconnect is designated as 160 in the first layer, 160' in the second layer, and 160" in the third layer.

Figure 14:
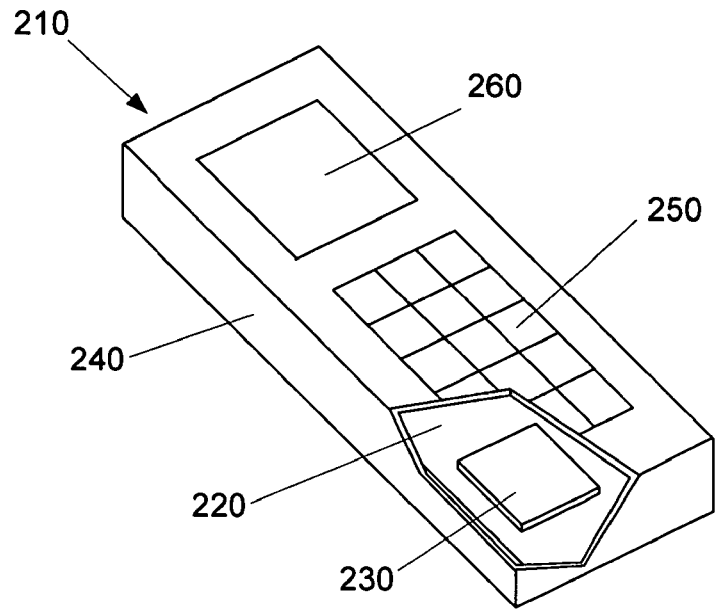
FIG. 14 is an oblique view of a hand-held device having a microelectronic assembly of the present integrated therein, according to the present invention.

The packages formed with the interconnects having an alloyed underlayer of the present invention may be used in a hand-held device 210, such as a cell phone or a personal data assistant (PDA), as shown in FIG. 14. The hand-held device 210 may comprise an external substrate 220 with at least one microelectronic device assembly 230, including but not limited to, a central processing units (CPUs), chipsets, memory devices, ASICs, and the like, having at least one alloyed underlayer as described above, within a housing 240. The external substrate 220 may be attached to various peripheral devices including an input device, such as keypad 250, and a display device, such an LCD display 260.

Figure 15:
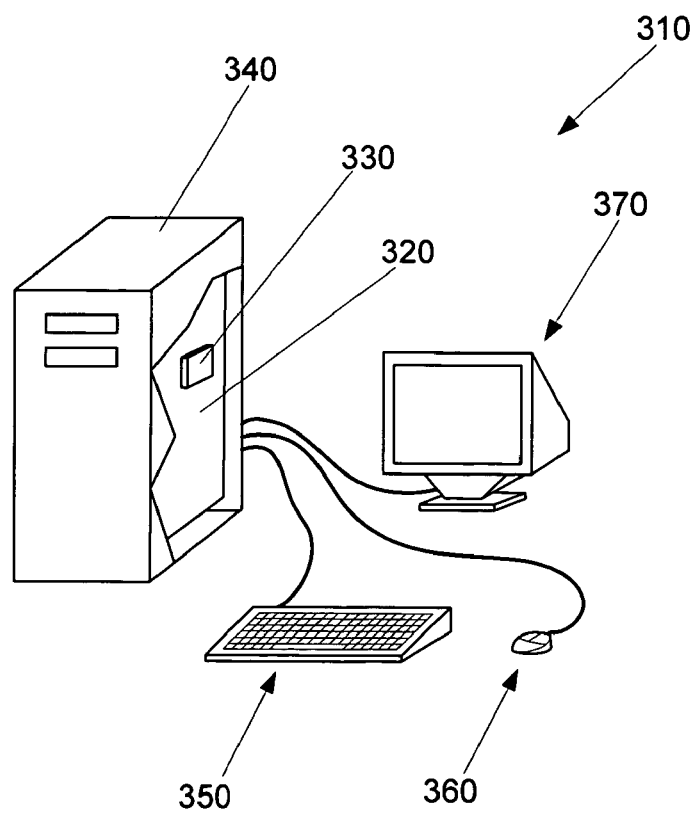
FIG. 15 is an oblique view of a computer system having a microelectronic assembly of the present integrated therein, according to the present invention.

The microelectronic device assemblies formed with the alloyed underlayer of the present invention may also be used in a computer system 310, as shown in FIG. 15. The computer system 310 may comprise an external substrate or motherboard 320 with at least one microelectronic device assembly 330, including but not limited to, a central processing units (CPUs), chipsets, memory devices, ASICs, and the like, having at least one alloyed underlayer as described above, within a housing or chassis 340. The external substrate or motherboard 320 may be attached to various peripheral devices including inputs devices, such as a keyboard 350 and/or a mouse 360, and a display device, such as a CRT monitor 370.

Having thus described in detail embodiments of the present invention, it is understood that the invention defined by the appended claims is not to be limited by particular details set forth in the above description, as many apparent variations thereof are possible without departing from the spirit or scope thereof.

What is claimed is:

1. A method of fabricating an interconnect, comprising:
   providing at least one dielectric layer;
   forming at least one opening extending into said at least one dielectric layer, wherein said opening is defined by at least one side;
   sequentially depositing a barrier material and a noble metal at least within said opening;
   annealing said barrier material and said noble metal to form an alloyed underlayer; and
   plating at least one conductive material to fill said opening and abut said underlayer.

2. The method of claim 1, wherein depositing said barrier material comprises depositing a refractory metal barrier material.

3. The method of claim 1, wherein depositing said barrier material comprises depositing a barrier material selected form the group consisting of tantalum, titanium, tungsten, molybdenum, or zirconium.

4. The method of claim 1, wherein depositing said barrier material comprises depositing a carbided barrier material.

5. The method of claim 1, wherein depositing said barrier material comprises depositing a nitrided barrier material.

6. The method of claim 1, wherein depositing said noble metal comprises depositing a noble metal selected from the group consisting of ruthenium, platinum, palladium, rhenium, osmium, iridium, gold, and rhodium.

* * * * *